United States Patent
John et al.

(10) Patent No.: US 8,604,949 B2
(45) Date of Patent: Dec. 10, 2013

(54) SERIAL-TO-PARALLEL CONVERTER, AND DISPLAY DEVICE INCORPORATING THE SAME

(75) Inventors: Gareth John, Berkshire (GB); Patrick Zebedee, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 256 days.

(21) Appl. No.: 13/283,060

(22) Filed: Oct. 27, 2011

(65) Prior Publication Data

US 2013/0106804 A1 May 2, 2013

(51) Int. Cl.
*H03M 9/00* (2006.01)

(52) U.S. Cl.
USPC .......................................... 341/100; 341/101

(58) Field of Classification Search
USPC ......... 341/100, 101; 345/96, 89, 209, 99, 204
See application file for complete search history.

(56) References Cited

U.S. PATENT DOCUMENTS

| | | | |
|---|---|---|---|
| 5,295,174 A | 3/1994 | Shimizu | |
| 6,259,387 B1 * | 7/2001 | Fukazawa | ...................... 341/100 |
| 2009/0040082 A1 | 2/2009 | Hinz et al. | |

FOREIGN PATENT DOCUMENTS

| | | |
|---|---|---|
| JP | 05-020887 A | 1/1993 |
| JP | 2000-244330 A | 9/2000 |
| WO | 2009/028353 A1 | 3/2009 |
| WO | 2009/130989 A1 | 10/2009 |

* cited by examiner

*Primary Examiner* — Joseph Lauture
(74) *Attorney, Agent, or Firm* — Renner, Otto, Boisselle & Sklar, LLP

(57) ABSTRACT

A serial-to-parallel converter which includes n input latching elements; k intermediate latching elements, and n output latching elements configured to sample outputs of the k intermediate latching elements and a remaining (n−k) input latching elements of the n input latching elements, respectively, after the nth data of the n successive data has been sampled by the nth input latching element and before the kth data of a next n successive data in the serial input data stream has been sampled by the kth input latching element, wherein the n input latching elements and the k intermediate latching elements are transparent for one state of their clock input, and n and k are positive integers, where n>k.

10 Claims, 15 Drawing Sheets

3
SERIAL-TO-PARALLEL CONVERTER, AND DISPLAY DEVICE INCORPORATING THE SAME

TECHNICAL FIELD

The invention relates to a serial-to-parallel converter, suitable for use in monolithic display drivers for Active Matrix Liquid Crystal Displays (AMLCDs). The invention further relates to a display device including such a serial-to-parallel converter.

BACKGROUND ART

Serial-to-parallel converters are used to convert serial input data into parallel data in active matrix displays, for example. FIG. 1 shows a typical serial-to-parallel converter using D-type Flip Flops (DFFs). A four-stage shift register 2 stores four samples of the serial input data DIN. The shift register outputs Q1-4 are then simultaneously sampled by output DFFs 4, which hold the data on outputs DOUT1-4 until the next four samples have been stored.

FIG. 2 shows an alternative serial-to-parallel converter composed of DFFs. Serial input data DIN is common to four DFFs 10-16 controlled by separate sampling signals SMP1-4. Four samples of DIN are stored and, again, outputs Q1-4 are simultaneously sampled by output DFFs 18, which hold the data on outputs DOUT1-4 until the next four samples have been stored.

In both FIG. 1 and FIG. 2, the output latches 4 and 18 respectively are activated by the rising edge of the transfer signal TRAN. This needs to occur when the correct data is present on Q1-4. Otherwise, incorrect data will be sampled and held on DOUT1-4. This may occur due to timing errors introduced by signal propagation delays within the display.

FIGS. 3 and 4 show a typical DFF and its operation respectively. When CK is low, the first and second D-Latches (DLs) are transparent and latched respectively. When CK is high, the first DL is latched and its output passed to Q via the now transparent second latch. The DFF itself is not transparent since the first DL is latched when CK is high. In this way, transitions in Q only occur on the rising edges of CK when Q is latched.

US patent publication 2009/0040082 (Hinz et al., published 12 Feb. 2009) details a serial-to-parallel converter using DFFs. However, DFFs consume more power than DLs, occupy a larger layout area and have lower yield.

SUMMARY OF INVENTION

The invention is a serial-to-parallel converter using digital latches, and preferably D-Latches. D-Latches (DLs) have fewer components and consume less power than D-type Flip Flops (DFFs). The invention has low susceptability to timing errors due to signal propagation delays and has a wide-margin of operation.

According to an aspect of the invention, a serial-to-parallel converter is provided which includes n input latching elements, $INL_1, INL_2, \ldots INL_n$, configured to sample n successive data of a serial input data stream, respectively; k intermediate latching elements, $IL_1, IL_2, \ldots IL_k$, configured to sample outputs of a first k input latching elements, $INL_1, INL_2, \ldots INL_k$, of the n input latching elements, respectively, after a first k data of the n successive data have been sampled by the first k input latching elements, and before a final data of the n successive data has been sampled by the nth input latching element, $INL_n$, and n output latching elements, $OL_1$, $OL_2, \ldots, OL_n$, configured to sample outputs of the k intermediate latching elements and a remaining (n−k) input latching elements, $INL_{k+1}, \ldots INL_{n-1}, INL_n$, of the n input latching elements, respectively, after the nth data of the n successive data has been sampled by the nth input latching element, $INL_n$, and before the kth data of a next n successive data in the serial input data stream has been sampled by the kth input latching element, $IN_k$, wherein the n input latching elements and the k intermediate latching elements are transparent for one state of their clock input, and n and k are positive integers, where n>k.

According to another aspect, the serial-to-parallel converter further includes q intermediate latching elements $IL_{n-q}, IL_{n-q+1}, \ldots, IL_n$, where q is a positive integer, the q intermediate latching elements being transparent for one state of their clock input; and a control circuit for controlling a scanning direction of the serial-to-parallel converter in response to a control input, wherein in a first scanning direction the n successive data are sampled and output by way of the k intermediate latching elements as recited in claim 1, and the q intermediate latching elements remain transparent, and wherein in a second scanning direction, the n input latching elements are configured to sample n successive data of the serial input data stream, from the nth input latching element to the first input latching element, respectively, the q intermediate latching elements are configured to sample outputs of a first q input latching elements, $IN_{n-q+1}, IN_{n-q+2}, \ldots, IN_n$, of the n input latching elements, respectively, after a first q data of the n successive data have been sampled by the first q input latching elements, and before a final data of the n successive data has been sampled by the first input latching element, $IN_1$, the n output latching elements are configured to sample outputs of the q intermediate latching elements and a remaining (n−q) input latching elements $IN_{n-q}, IN_{n-q-1}, \ldots, IN_1$, of the n input latching elements, respectively, after the nth data of the n successive data has been sampled by the first input latching element and before the qth data of a next n successive data in the serial input data stream has been sampled by the qth input latching element, $IN_{n-q+1}$, and the k intermediate latching elements remain transparent.

In accordance with another aspect, the n input latching elements are configured to sample in response to a respective sampling signal, $SMP_1, SMP_2, \ldots, SMP_n$, and wherein the k intermediate latching elements are configured to sample in response to sampling signal SMPp, where p>k.

According to yet another aspect, the n input latching elements are configured to sample in response to a respective sampling signal, $SMP_1, SMP_2, \ldots, SMP_n$, and wherein the k intermediate latching elements are configured to sample in response to individual sampling signals SMPx, where x is a positive integer and x>k.

In accordance with still another aspect, in the second scanning direction the q intermediate latching elements are configured to sample in response to sampling signal SMPl, where l is a positive integer and l<n−q.

According to still another aspect, in the second scanning direction the q intermediate latching elements are configured to sample in response to individual sampling signals SMPz, where z is a positive integer and z<n−q.

In accordance with another aspect, the n successive data are sampled by the n input latching elements one per data period, and wherein the data sampled by the k intermediate latching elements are presented to the corresponding output latches for sampling for at least two data periods.

According to another aspect, the n successive data are sampled by the n input latching elements one per data period, and wherein the data sampled by the q intermediate latching elements are presented to the corresponding output latches for sampling for at least two data periods.

In yet another aspect, each latching element is a D-Latch.

In accordance with another aspect, an active matrix display device includes a data driver and a scan driver, wherein at least one of the data driver and scan driver include a serial-to-parallel converter as described herein.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features.

DESCRIPTION OF REFERENCE NUMERALS

Figure 1:
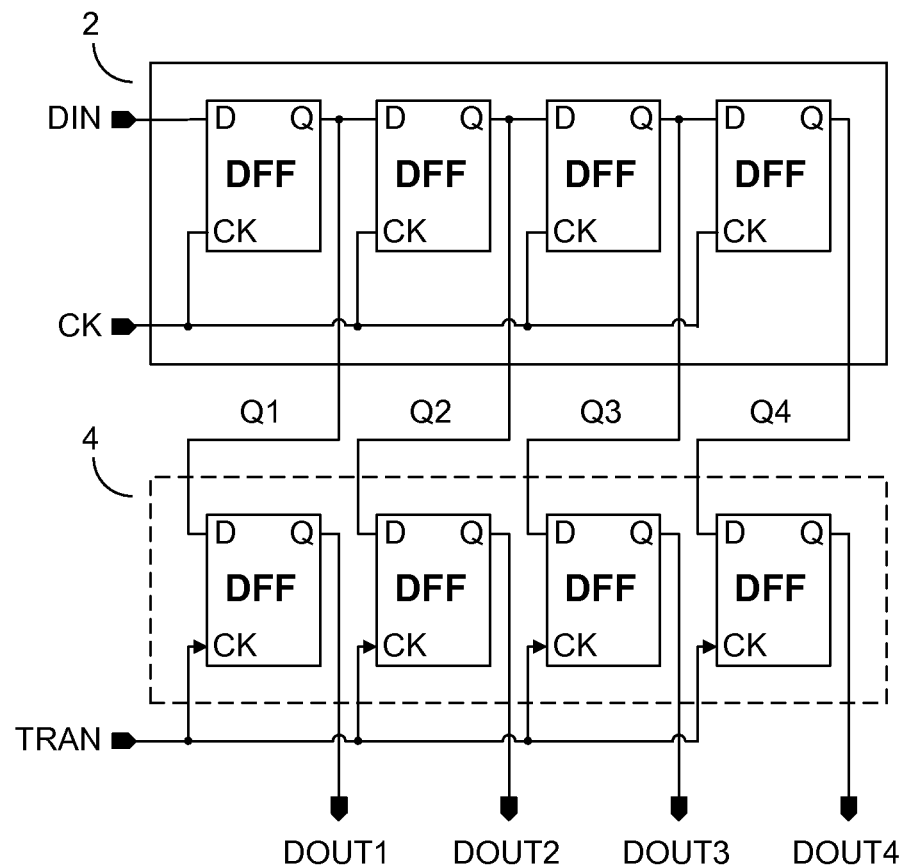
FIG. 1 is a block schematic diagram of a known type of serial-to-parallel converter.

2 shift register
4 & 18 output latches (d-type flip-flops)
10-16 d-type flip-flop
40 pixel matrix
42 data driver
44 scan driver
46 level shifters
48 serial-to-parallel converters
50 digital-to-analogue converters
52 analogue driver & sampling switches
54 timing generator
60-66, 70-88 & 90-120 d-latch
68 output latches (d-latches)
122 & 124 nand gate
126-130 inverter

DETAILED DESCRIPTION OF INVENTION

Figure 5:
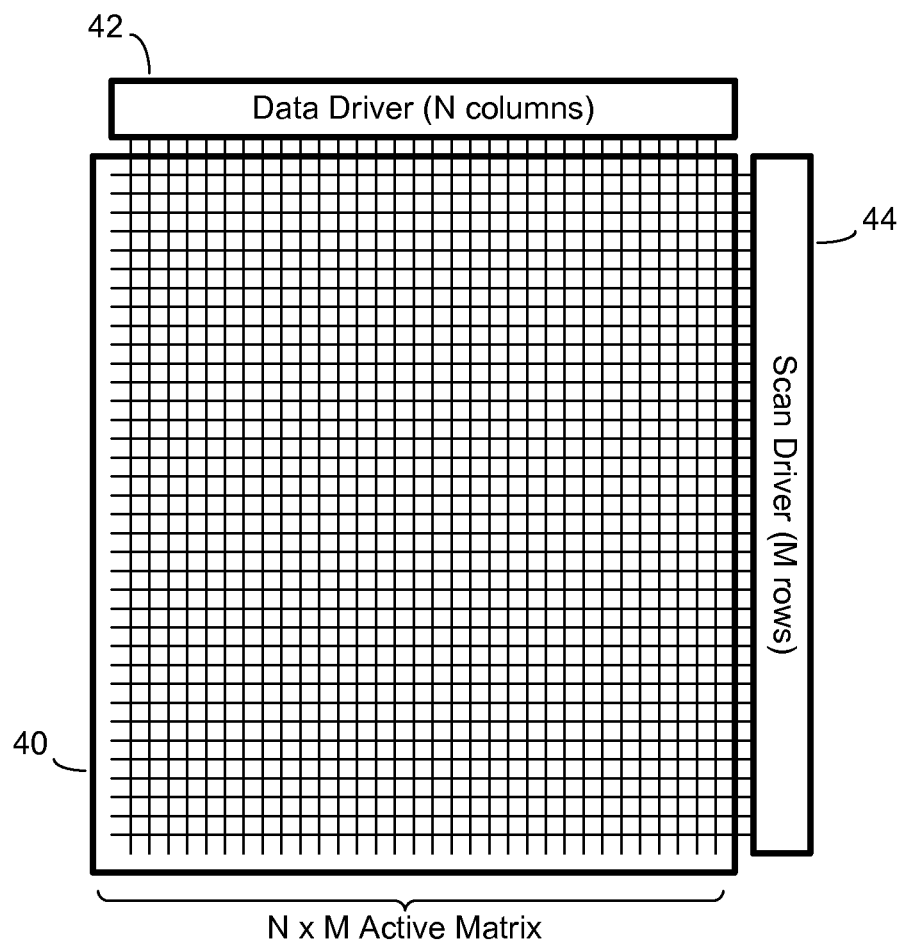
FIG. 5 is a block diagram illustrating an active matrix display which may incorporate a serial-to-parallel converter in accordance with the present invention.

FIG. 5 shows an active matrix display according to an embodiment of the invention. The display is made up of a matrix 40 of picture elements (pixels), data driver 42 and scan driver 44.

Figure 6:
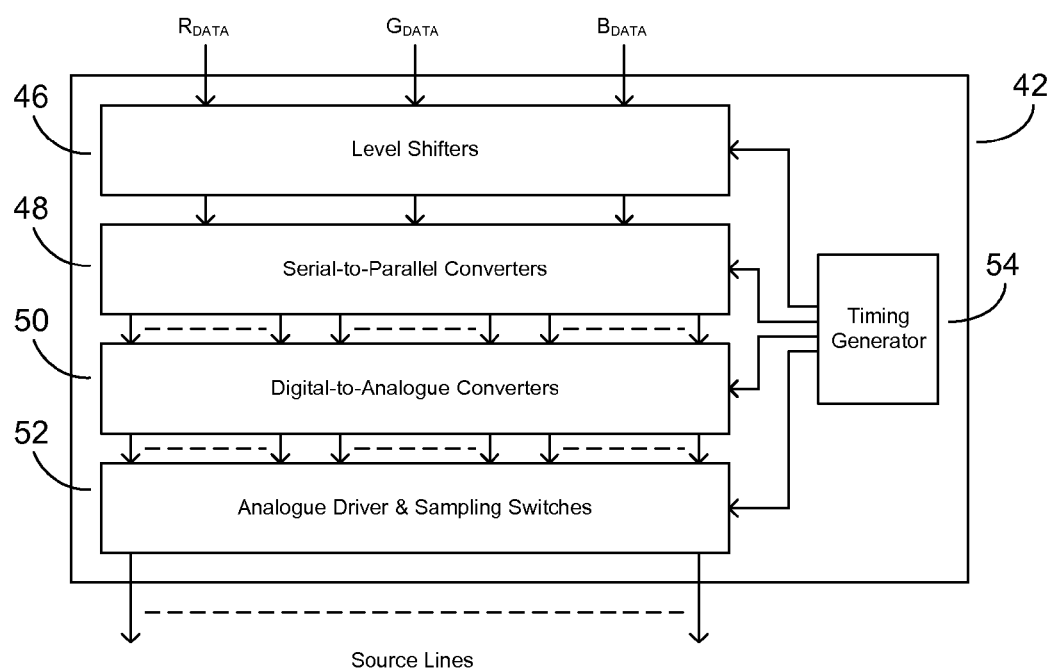
FIG. 6 shows a block diagram of a display source driver.

FIG. 6 shows a data driver 42. Level shifters 46 boost low-voltage image (RGB) data to appropriate levels. Serial-to-parallel converters 48 convert the serial R, G and B data streams to the parallel format required by the digital-to-analogue converters 50. The analogue driver and sampling switches 52 switch the analogue data to the pixels via source lines. A timing generator 54 controls and synchronizes these sub-blocks.

The data driver 42 spans one side of the display; for a 2.22" display, the side bezel length is approximately 54.22 mm. Long wire tracks introduce significant signal delays and increase susceptibility to timing errors. For example, serial-to-parallel converters 48 furthest from the timing generator 54 will sample image data later than those closest. Increasing the resilience of such circuits will improve reliability and yield.

In addition, the data driver 42 and scan driver 44 may be bi-directional. Drivers 42 and 44 in FIG. 5 are typically uni-directional; outputs transition sequentially in one direction. Bi-directional drivers allow outputs to transition sequentially in either direction. For example, the outputs of data driver 42 would be able to traverse the display left-to-right or right-to-left. Likewise, the outputs of scan driver 44 would be able to traverse the display top-to-bottom or bottom-to-top. In this way, image orientation can be controlled. During manufacture, the display can be fitted in either orientation with its image orientation adjusted retrospectively.

Figure 7:
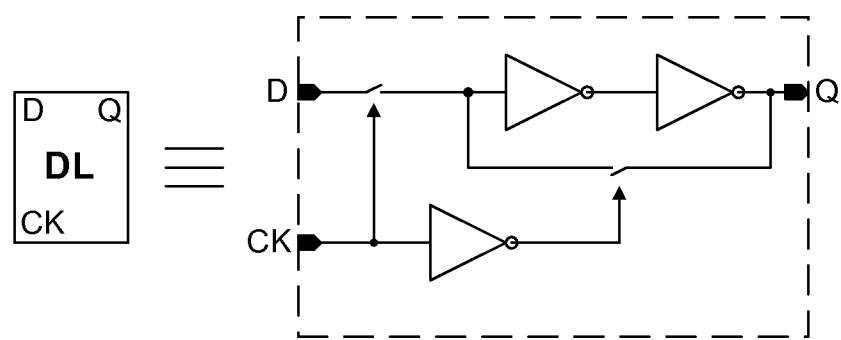
FIG. 7 is a block schematic diagram of a D-latch.
Figure 8:
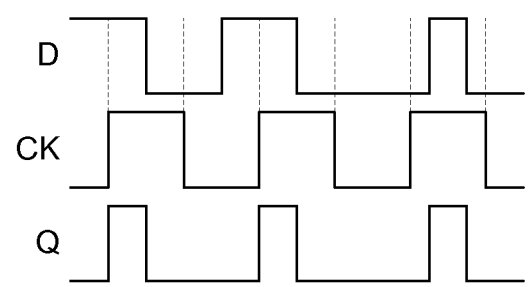
FIG. 8 is a waveform diagram illustrating the operation of the D-latch of FIG. 7.

FIGS. 7 and 8 show a D-Latch (DL) and its operation respectively. DLs use less than a half the number of components as D-type Flip Flops (DFFs), and so it is preferable to use DLs for lower power consumption, smaller layout area and higher yield. In FIG. 8, when CK is high, data on the D-input is passed straight through to the output Q via two inverters (the latch is 'transparent'). When CK is low, D is disconnected and Q connected to the input of the first inverter. Q is now latched. In this way, transitions in Q only occur when CK is high, and data is latched on the falling edges of CK.

Figure 2:
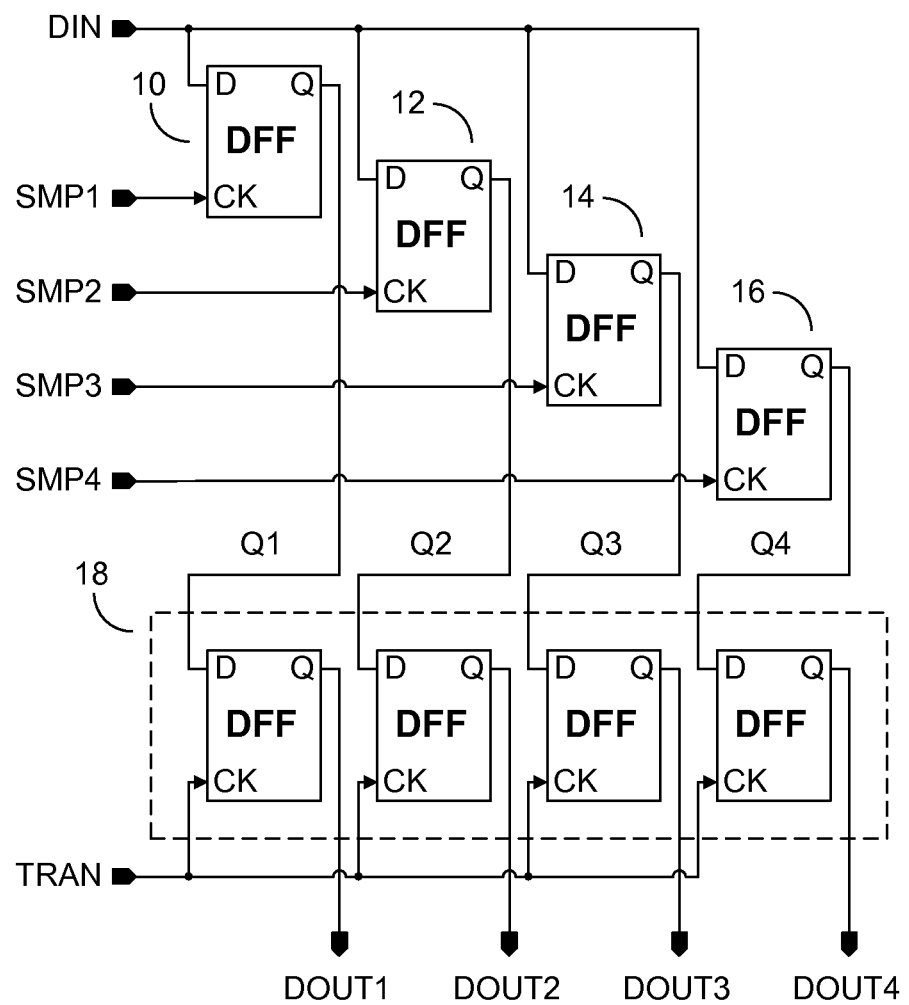
FIG. 2 is a block schematic diagram of a known type of serial-to-parallel converter.
Figure 3:
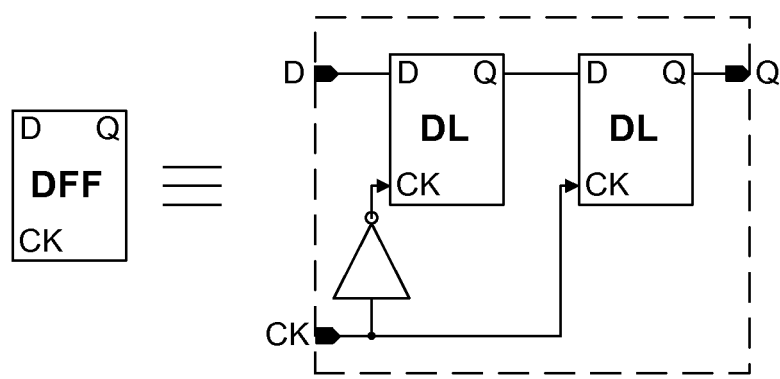
FIG. 3 is a block schematic diagram of a D-type flip-flop.
Figure 4:
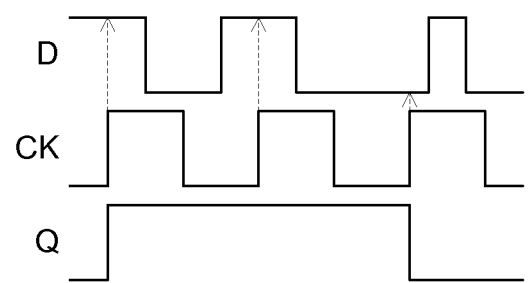
FIG. 4 is a waveform diagram illustrating the operation of the D-type flip-flop of FIG. 3.
Figure 9:
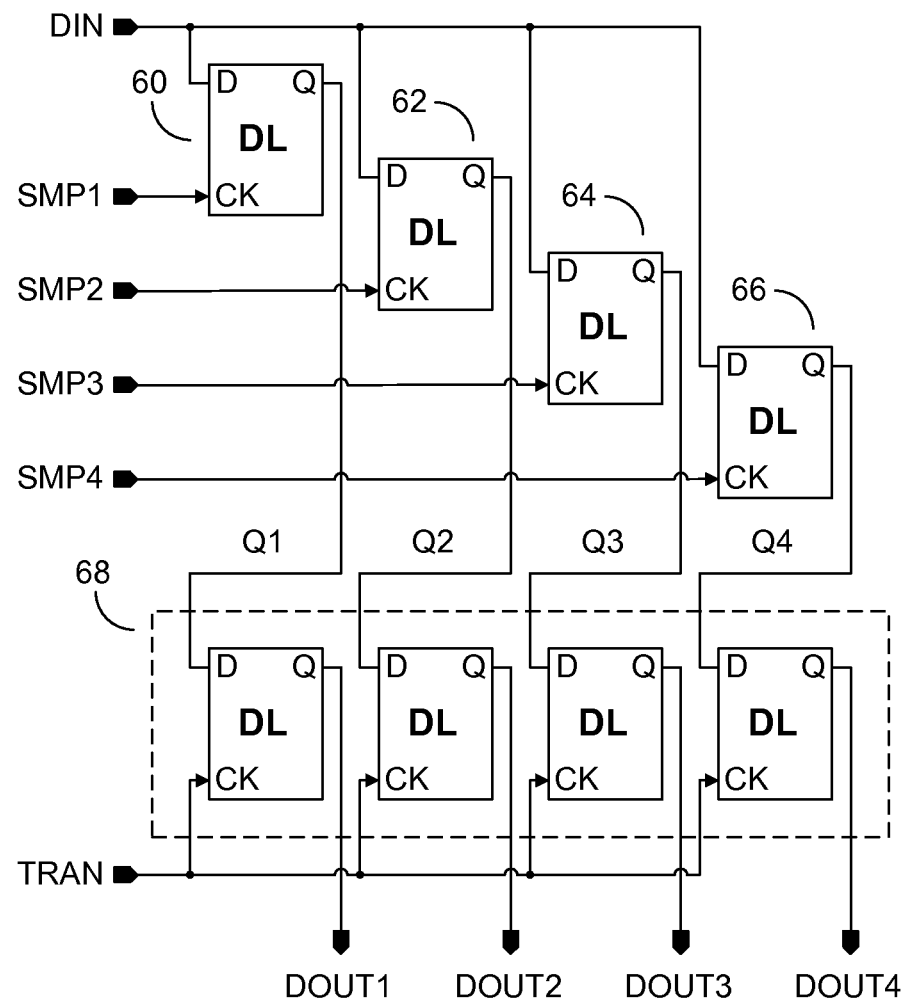
FIG. 9 is a block schematic diagram of a serial-to-parallel converter.

The serial-to-parallel converters described in the background art use DFFs. FIG. 9 shows a serial-to-parallel converter similar to FIG. 2 but composed of DLs. The input latches, DLs 60-66, are transparent when their sampling signals SMP1-4 are high and latch the serial input data DIN on the falling edges of SMP1-4. The output latches 68 are transparent when the transfer signal TRAN is high and store Q1-4 on the falling edges of TRAN.

Figure 10:
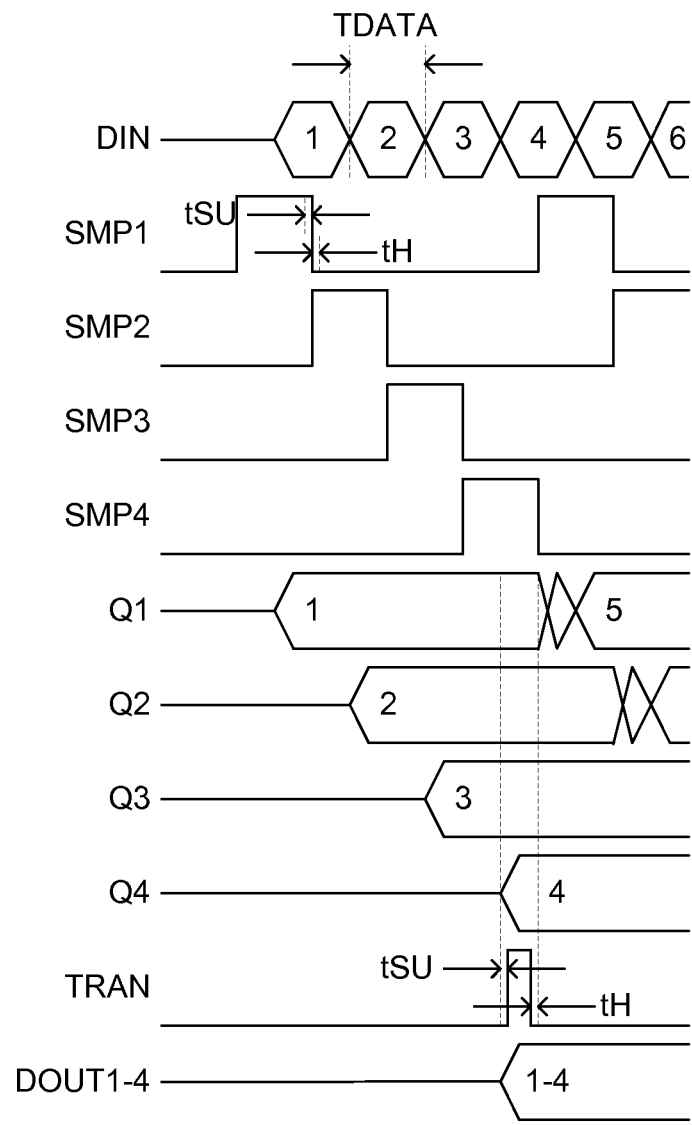
FIG. 10 is a waveform diagram illustrating the operation of the serial-to-parallel converter of FIG. 9.

FIG. 10 shows the operation of the serial-to-parallel converter of FIG. 9. The falling edges of SMP1-4 should occur between transitions in DIN. TRAN should be high when the correct data is present on Q1-4 (and thereby pass the correct data through to the output latches 68), resulting in a narrow pulse less than one clock cycle which is difficult to generate. In particular, the occurrences of all falling sampling edges are determined by the set-up (tSU) and hold (tH) times of the DLs. For example, the rising edge of TRAN should be at least tSU after the transition of Q4 and the falling edge at least tH before the transition of Q1. A slow falling edge can lead to incorrect data 5 on Q1 being sampled. In addition, Q4 may not be stable immediately, resulting in the parallel output data DOUT1-4 not being latched for the full four clock cycles.

Figure 11:
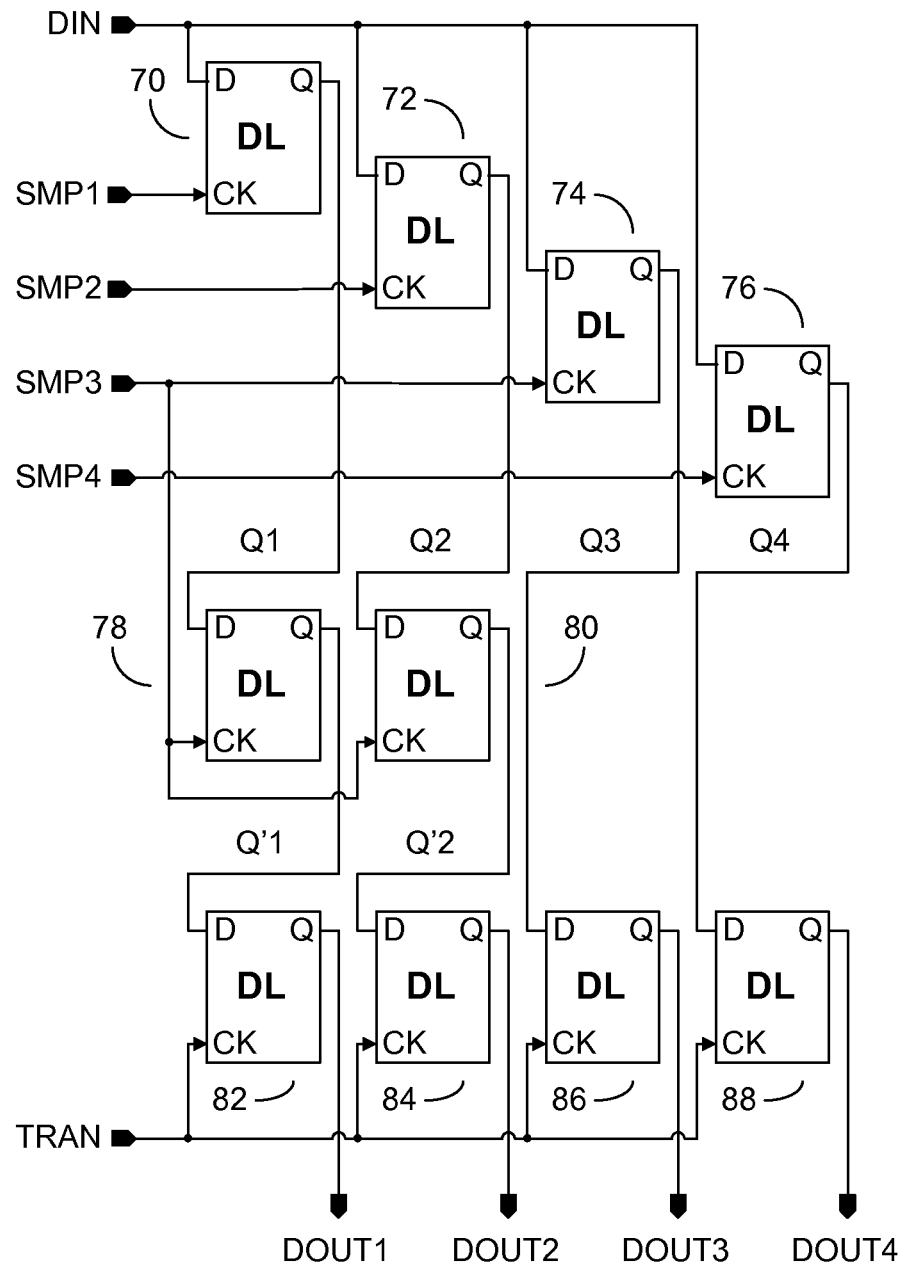
FIG. 11 is a block schematic diagram of a serial-to-parallel converter constituting an embodiment of the invention.

A first embodiment of a serial-to-parallel converter in accordance with the present invention is shown in FIG. 11. The serial input data DIN is converted to parallel output data DOUT1-4. The input latches (INLs) are DLs 70-76. DL 70 has DIN and sampling signal SMP1 connected to its D- and CK-inputs respectively. DL 72 has DIN and sampling signal SMP2 connected to its D- and CK-inputs respectively. DL 74 has DIN and sampling signal SMP3 connected to its D- and CK-inputs respectively. DL 76 has DIN and sampling signal SMP4 connected to its D- and CK-inputs respectively.

The intermediate latches (ILs) are DLs 78-80. DL 78 has the output Q1 of DL 70 and SMP3 connected to its D- and CK-inputs respectively. DL 80 has the output Q2 of DL 72 and SMP3 connected to its D- and CK-inputs respectively.

The output latches (OLs) are DLs 82-88. DL 82 has the output Q'1 of DL 78 and sampling signal TRAN connected to its D- and CK-inputs respectively. DL 84 has the output Q'2 of DL 80 and TRAN connected to its D- and CK-inputs respectively. DL 86 has the output Q3 of DL 74 and TRAN connected to its D- and CK-inputs respectively. DL 88 has the output Q4 of DL 76 and TRAN connected to its D- and CK-inputs respectively. The outputs of DLs 82-88 are the converter outputs DOUT1-4 respectively.

Figure 12:
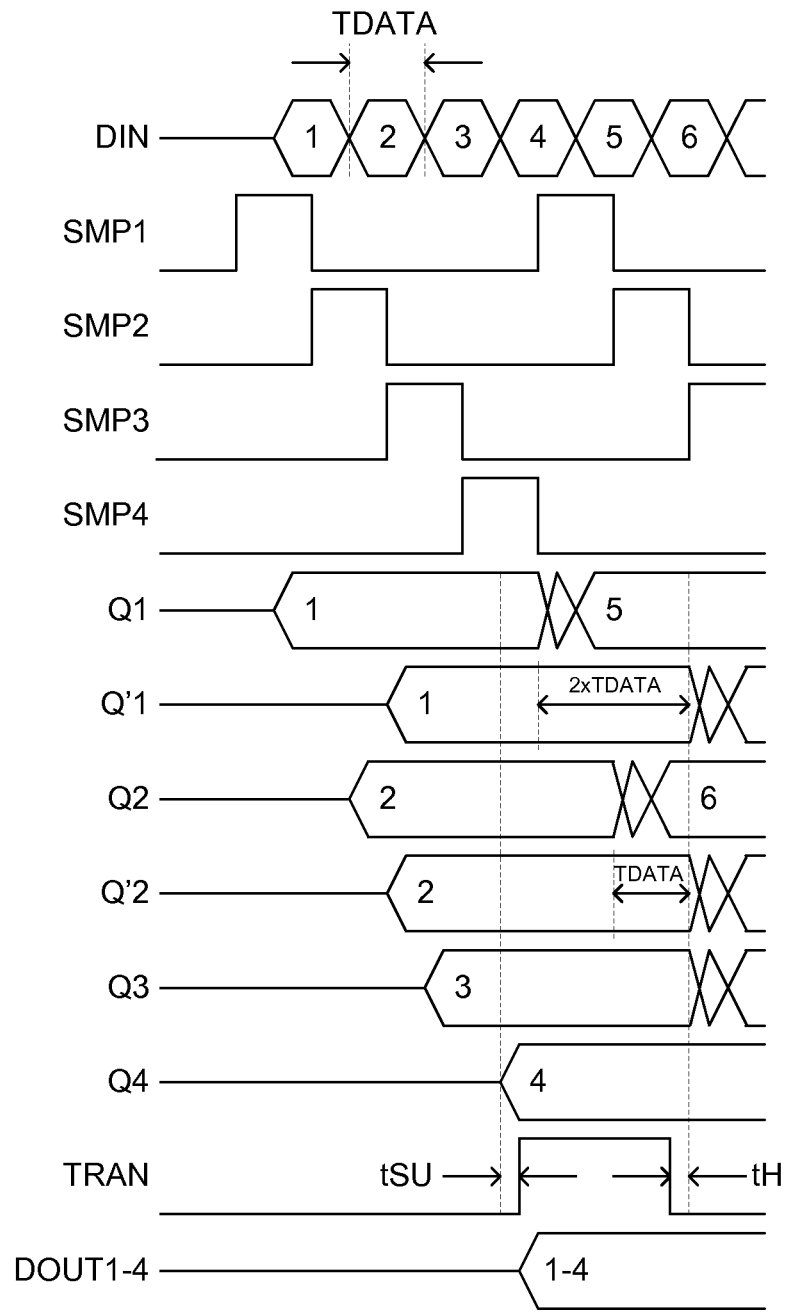
FIG. 12 is a waveform diagram illustrating the operation of the serial-to-parallel converter in FIG. 11.

FIG. 12 shows the operation of the embodiment in FIG. 11. Sampling signals SMP1-4, SMP3 and TRAN are the clocking signals for DLs 70-76, 78-80 and 82-88 respectively. DLs are transparent when their clock inputs are high and latch data on their D-inputs on falling clock edges. The falling edges of SMP1-4 should occur between data transitions on DIN for DLs 70-76 to correctly sample data 1-4 respectively. DLs 78-80 latch Q1-2 on the falling edge of SMP3. Thus, correct data 1 is presented to DL 82 on Q'1 for an additional two data periods (2*TDATA) and data 2 to DL 84 on Q'2 for an additional TDATA. Correct data 3-4 is presented to DLs 86-88 on Q3-4. In this way, DLs 82-88 have an additional 2*TDATA to sample correct data on Q'1-2 and Q3-4. TRAN should be high when the correct data is present on Q'1-2 and Q3-4. In particular, the rising edge of TRAN should be at least a set-up time (tSU) after the transition of Q4 and the falling edge at least a hold time (tH) before the transition of Q'1. It may be possible to use SMP1 as TRAN. Thus, susceptibility to timing errors and circuit complexity have been improved.

The serial-to-parallel converter of FIG. 11 can be extended to n stages for DLs 70-76 and DLs 82-88, and k stages using sampling signal SMPp for DLs 78-80, where n, k and p are positive integers and p>k. In addition, DLs 78-80 can have individual sampling signals SMPx, where x is a positive integer and x>k.

More generally, n input latching elements, $INL_1$, $INL_2$, ... $INL_n$, are configured to sample n successive data of a serial input data stream, respectively.

The k intermediate latching elements, $IL_1$, $IL_2$, ... $IL_k$, are configured to sample outputs of a first k input latching elements, $INL_1$, $INL_2$, ... $INL_k$, of the n input latching elements, respectively, after a first k data of the n successive data have been sampled by the first k input latching elements, and before a final data of the n successive data has been sampled by the nth input latching element, $INL_n$. The n output latching elements, $OL_1$, $OL_2$, ..., $OL_n$, are configured to sample outputs of the k intermediate latching elements, $IL_1$, $IL_2$, ... $IL_k$, and a remaining (n−k) input latching elements, $INL_{k+1}$, ... $INL_{n-1}$, $INL_n$, of the n input latching elements, respectively, after the nth data of the n successive data has been sampled by the nth input latching element, $INL_n$, and before the kth data of a next n successive data in the serial input data stream has been sampled by the kth input latching element, $INL_k$. The n input latching elements and the k intermediate latching elements are transparent for one state of their clock input, and n and k are positive integers, where n>k.

Figure 13:
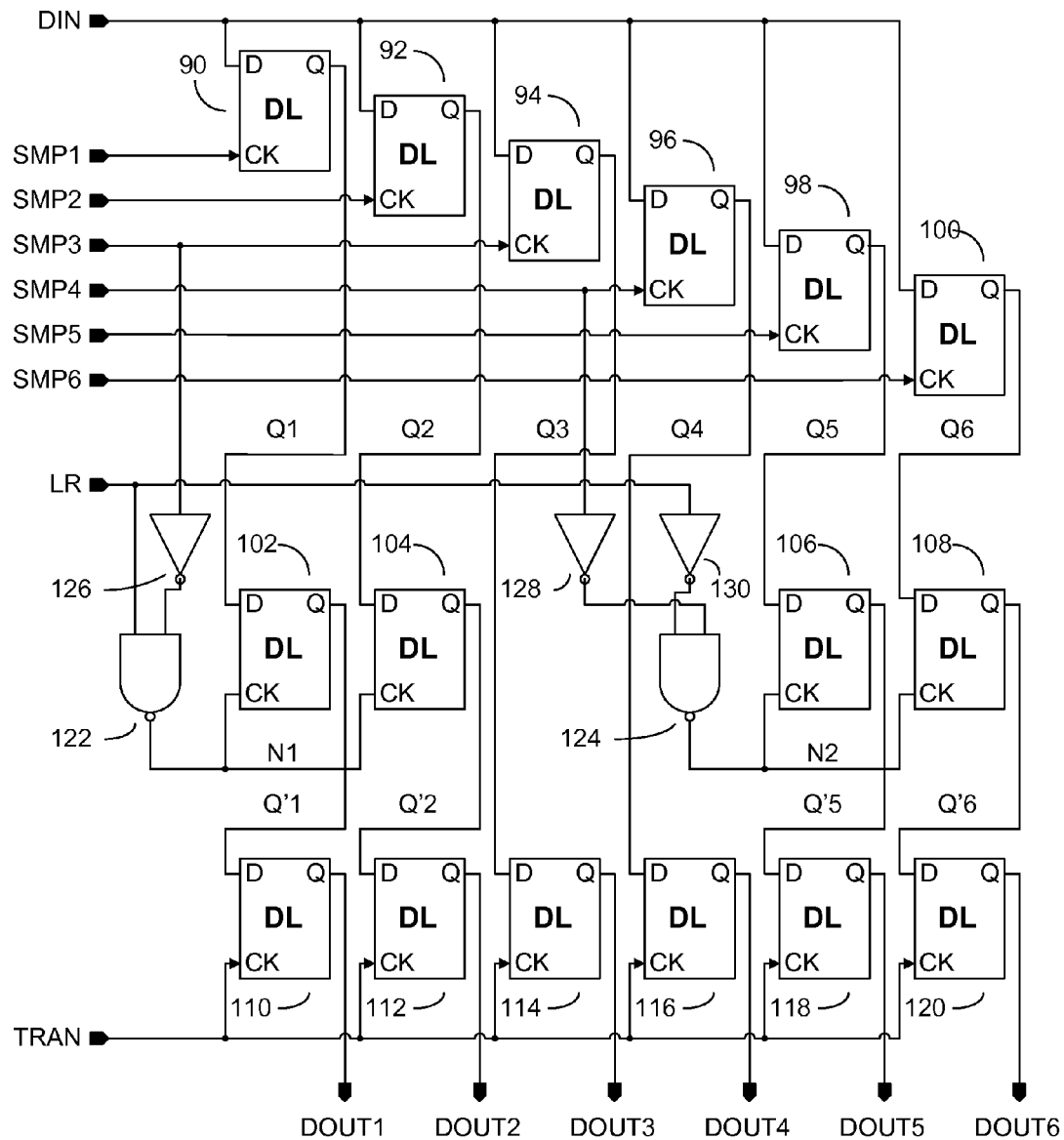
FIG. 13 is a block schematic diagram of a bi-directional serial-to-parallel converter constituting another embodiment of the invention.

FIG. 13 shows another embodiment of the present invention. Additional intermediate latches, logic and control signal LR allow bi-directional operation. The input latches (INLs) are DLs 90-100. DL 90 has DIN and sampling signal SMP1 connected to its D- and CK-inputs respectively. DL 92 has DIN and sampling signal SMP2 connected to its D- and CK-inputs respectively. DL 94 has DIN and sampling signal SMP3 connected to its D- and CK-inputs respectively. DL 96 has DIN and sampling signal SMP4 connected to its D- and CK-inputs respectively. DL 98 has DIN and sampling signal SMP5 connected to its D- and CK-inputs respectively. DL 100 has DIN and sampling signal SMP6 connected to its D- and CK-inputs respectively.

The intermediate latches (ILs) are DLs 102-104 similar to the embodiment of FIG. 11. Moreover, DLs 106-108 are included as q additional intermediate latches. DL 102 has the output Q1 of DL 90 and the output N1 of NAND 122 connected to its D- and CK-inputs respectively. DL 104 has the output Q2 of DL 92 and the output N1 of NAND 122 connected to its D- and CK-inputs respectively. DL 106 has the output Q5 of DL 98 and the output N2 of NAND 124 connected to its D- and CK-inputs respectively. DL 108 has the output Q6 of DL 100 and the output N2 of NAND 124 connected to its D- and CK-inputs respectively. SMP3 and SMP4 are connected to inverters 126 and 128 respectively. The output of inverter 126 and LR are the inputs to NAND 122. LR is connected to an inverter 130 whose output and the output of inverter 128 are the inputs to NAND 124. The inverters 126, 128, 130 and NANDs 122 and 128 represent an exemplary embodiment of a control circuit in accordance with the present invention by which a direction of scanning by the serial-to-parallel converter can be controlled by a control signal, e.g., LR.

The output latches (OLs) are DLs 110-120. DL 110 has the output Q'1 of DL 102 and sampling signal TRAN connected to its D- and CK-inputs respectively. DL 112 has the output Q'2 of DL 104 and TRAN connected to its D- and CK-inputs respectively. DL 114 has the output Q3 of DL 94 and TRAN connected to its D- and CK-inputs respectively. DL 116 has the output Q4 of DL 96 and TRAN connected to its D- and CK-inputs respectively. DL 118 has the output Q'5 of DL 106 and TRAN connected to its D- and CK-inputs respectively. DL 120 has the output Q'6 of DL 108 and TRAN connected to its D- and CK-inputs respectively. The outputs of DLs 110-120 are the converter outputs DOUT1-6 respectively.

Figure 14:
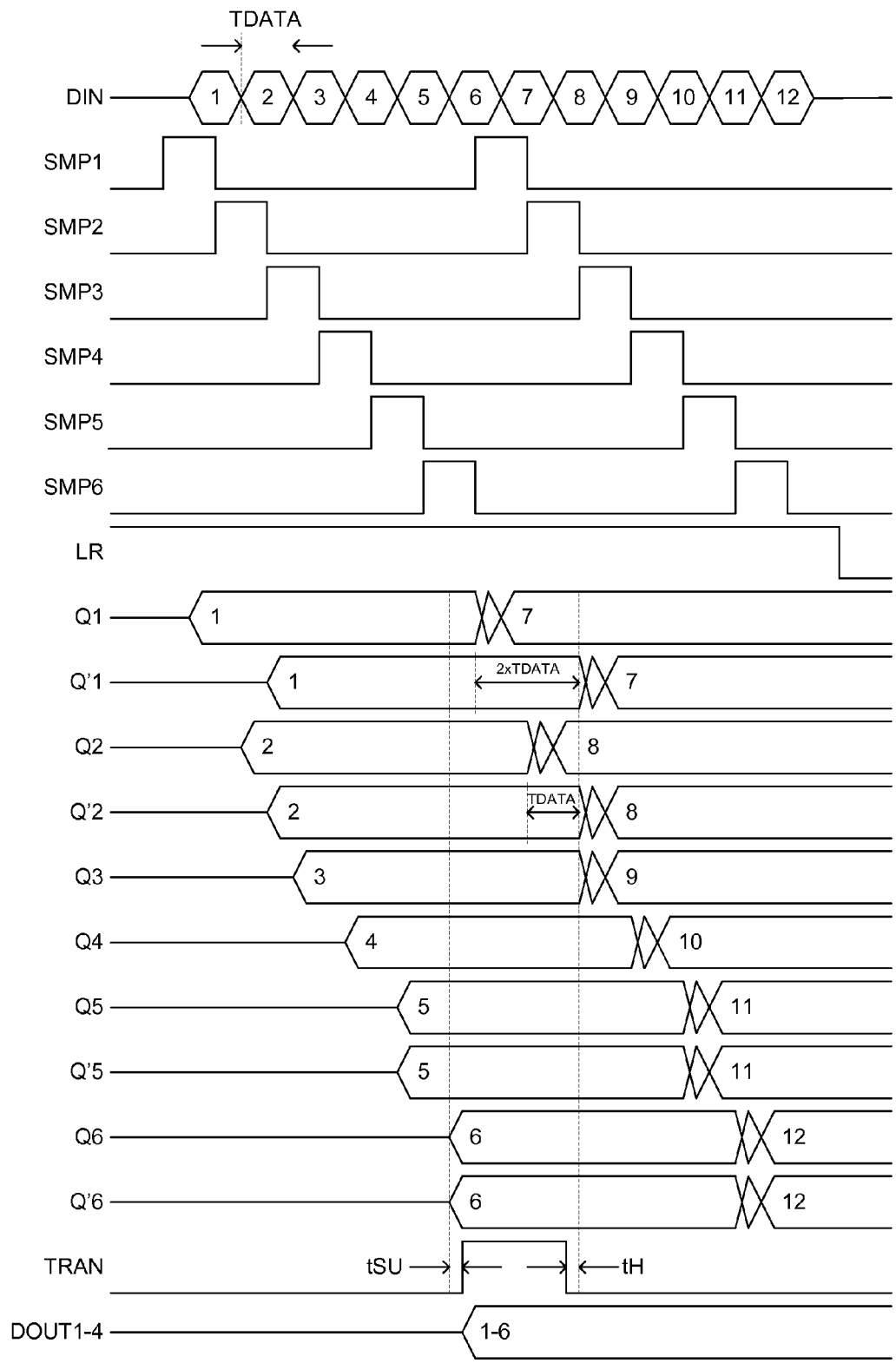
FIG. 14 is a waveform diagram illustrating the operation of the serial-to-parallel converter of FIG. 13.
Figure 15:
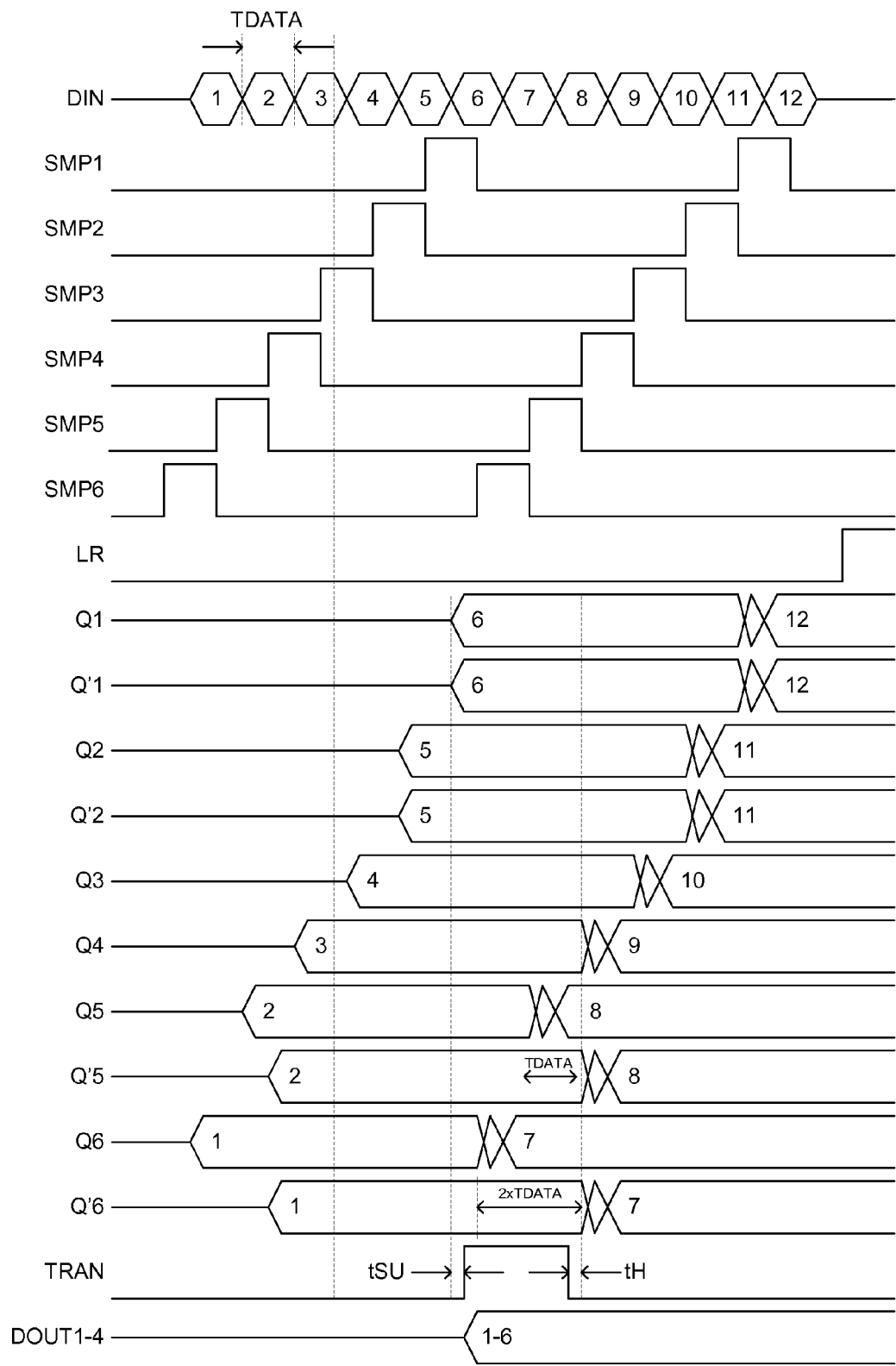
FIG. 15 is a waveform diagram illustrating the operation of the serial-to-parallel converter of FIG. 13.

FIGS. 14 and 15 illustrate the operation of the serial-to-parallel converter of FIG. 13. Sampling signals SMP1-6 and control signal LR determine the location of the first stage of the converter. In FIG. 14, LR is high and SMP1-6 activate DLs 90-100 in FIG. 13 from left to right (first scanning direction). In addition, the clock signals to DLs 106-108 are held high due to LR and, consequently, DLs 106-108 are transparent. DLs 102-104 are activated by SMP3. The first stage is the left-most stage and operation is the same as FIG. 11. Just like DLs 78-80 in FIG. 11, correct data 1 is presented to DL 110 on Q'1 for an additional two data periods (2*TDATA) and data 2 to DL 112 on Q'2 for an additional TDATA. Correct data 3-4 is presented to DLs 114-116 on Q3-4, and correct data 5-6 is presented to DLs 118-120 on Q5-6 via transparent DLs 116-118. In this way, DLs 110-120 have an additional 2*TDATA to sample correct data on Q'1-2, Q3-4 and Q'5-6.

In FIG. 15, LR is low and SMP1-6 activate DLs 90-100 in FIG. 13 from right to left (second scanning direction). The clock signals to DLs 102-104 are held high due to LR and, consequently, DLs 102-104 are transparent. DLs 106-108 are activated by SMP4. The first stage is the rightmost stage and operation is similar to FIG. 11.

The intermediate latches can be enabled by sampling signals other than those described for FIGS. 11 and 13. For example, SMP5 and SMP2 can be used in FIG. 13.

The serial-to-parallel converter of FIG. 13 can be extended to n stages for DLs 90-100 and DLs 110-120, k stages using sampling signal SMPp for DLs 102-104, and q stages using sampling signal SMPl for DLs 106-108, where n, k, p, q and l are positive integers, k<p≤n and 1≤l<n−q. In addition, DLs 102-104 can have individual sampling signals SMPx, where k<x≤n, and DLs 106-108 can have individual sampling signals SMPz, where 1≤z<n−q, where z is also a positive integer.

More generally, with respect to the embodiment of FIG. 13 operation in the left-to-right scanning direction is as described above with respect to the embodiment of FIG. 11. Insofar as operation in the right-to-left scanning direction, n input latching elements are configured to sample n successive data of the serial input data stream, from the nth input latching element to the first input latching element, respectively. There are q intermediate latching elements configured to sample outputs of a first q input latching elements, $IN_{n-q+1}$, $IN_{n-q+2}$, ..., $IN_n$, of the n input latching elements, respectively, after a first q data of the n successive data have been sampled by the first q input latching elements, and before a final data of the n successive data has been sampled by the first input latching element, $IN_1$. The n output latching elements are configured to sample outputs of the q intermediate latching elements and a remaining (n−q) input latching elements $IN_{n-q}$, $IN_{n-q-1}$, ..., $IN_1$, of the n input latching elements, respectively, after the nth data of the n successive data has been sampled by the first input latching element and before the qth data of a next n successive data in the serial input data stream has been sampled by the qth input latching element, $IN_{n-q+1}$, and the k intermediate latching elements remain transparent.

Referring again to FIG. 5, an active matrix display in accordance with the present invention employs one or more serial-to-parallel converters as described herein utilizing one or more intermediate latches. The serial-to-parallel converter(s) may be used in the data driver to provide data to the pixels for example, and/or to provide scan line data to the rows as will be appreciated.

While the present invention has been described primarily in the context of latches in the form of digital latches DL, it will be appreciated that the invention has utility with a variety of different types of latching elements, and is not limited in the broadest sense to the particular type of digital latch DL described herein.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The invention is suitable for use in monolithic display drivers for Active Matrix Liquid Crystal Displays (AMLCDs). In particular, mobile AMLCDs are required to have low power consumption and function over wide variations in operating conditions. This invention achieves low power consumption over a wide-margin of operation.

The invention claimed is:

1. A serial-to-parallel converter, comprising:
   n input latching elements, $INL_1$, $INL_2$, ... $INL_n$, configured to sample n successive data of a serial input data stream, respectively;

k intermediate latching elements, $IL_1$, $IL_2$, ... $IL_k$, configured to sample outputs of a first k input latching elements, $INL_1$, $INL_2$, ... $INL_k$, of the n input latching elements, respectively, after a first k data of the n successive data have been sampled by the first k input latching elements, and before a final data of the n successive data has been sampled by the nth input latching element, $INL_n$, and n output latching elements, $OL_1$, $OL_2$, ..., $OL_n$, configured to sample outputs of the k intermediate latching elements and a remaining (n−k) input latching elements, $INL_{k+1}$, ... $INL_{n-1}$, $INL_n$, of the n input latching elements, respectively, after the nth data of the n successive data has been sampled by the nth input latching element, $INL_n$, and before the kth data of a next n successive data in the serial input data stream has been sampled by the kth input latching element, $IN_k$, wherein the n input latching elements and the k intermediate latching elements are transparent for one state of their clock input, and n and k are positive integers, where n>k.

2. The serial-to-parallel converter according to claim 1, further comprising:
   q intermediate latching elements $IL_{n-q}$, $IL_{n-q+1}$, ..., $IL_n$, where q is a positive integer, the q intermediate latching elements being transparent for one state of their clock input; and a control circuit for controlling a scanning direction of the serial-to-parallel converter in response to a control input, wherein in a first scanning direction the n successive data are sampled and output by way of the k intermediate latching elements as recited in claim 1, and the q intermediate latching elements remain transparent, and wherein in a second scanning direction,
   the n input latching elements are configured to sample n successive data of the serial input data stream, from the nth input latching element to the first input latching element, respectively, the q intermediate latching elements are configured to sample outputs of a first q input latching elements, $IN_{n-q+1}$, $IN_{n-q+2}$, ..., $IN_n$, of the n input latching elements, respectively, after a first q data of the n successive data have been sampled by the first q input latching elements, and before a final data of the n successive data has been sampled by the first input latching element, $IN_1$, the n output latching elements are configured to sample outputs of the q intermediate latching elements and a remaining (n−q) input latching elements $IN_{n-q}$, $IN_{n-q-1}$, ..., $IN_1$, of the n input latching elements, respectively, after the nth data of the n successive data has been sampled by the first input latching element and before the qth data of a next n successive data in the serial input data stream has been sampled by the qth input latching element, $IN_{n-q+1}$, and the k intermediate latching elements remain transparent.

3. The serial-to-parallel converter according to claim 2, wherein the n successive data are sampled by the n input latching elements one per data period, and wherein the data sampled by the q intermediate latching elements are presented to the corresponding output latches for sampling for at least two data periods.

4. The serial-to-parallel converter according to claim 1, wherein the n input latching elements are configured to sample in response to a respective sampling signal, $SMP_1$, $SMP_2$, ..., $SMP_n$, and wherein the k intermediate latching elements are configured to sample in response to sampling signal SMPp, where p>k.

5. The serial-to-parallel converter according to claim 4, wherein in the second scanning direction the q intermediate latching elements are configured to sample in response to sampling signal SMPl, where l is a positive integer and l<n−q.

6. The serial-to-parallel converter according to claim 1, wherein the n input latching elements are configured to sample in response to a respective sampling signal, $SMP_1$, $SMP_2$, ..., $SMP_n$, and wherein the k intermediate latching elements are configured to sample in response to individual sampling signals SMPx, where x is a positive integer and x>k.

7. The serial-to-parallel converter according to claim 6, wherein in the second scanning direction the q intermediate latching elements are configured to sample in response to individual sampling signals SMPz, where z is a positive integer and z<n−q.

8. The serial-to-parallel converter according to claim 1, wherein the n successive data are sampled by the n input latching elements one per data period, and wherein the data sampled by the k intermediate latching elements are presented to the corresponding output latches for sampling for at least two data periods.

9. The serial-to-parallel converter according to claim 1, wherein each recited latching element is a D-Latch.

10. An active matrix display device comprising a data driver and a scan driver, wherein at least one of the data driver and scan driver comprise a serial-to-parallel converter according to claim 1.

* * * * *